United States Patent
Peterson

(10) Patent No.: US 6,690,026 B2
(45) Date of Patent: Feb. 10, 2004

(54) METHOD OF FABRICATING A THREE-DIMENSIONAL ARRAY OF ACTIVE MEDIA

(75) Inventor: Jeff J. Peterson, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 09/967,814

(22) Filed: Sep. 28, 2001

(65) Prior Publication Data

US 2003/0062516 A1 Apr. 3, 2003

(51) Int. Cl.[7] .............................................. H01L 47/00
(52) U.S. Cl. ...................... 257/4; 257/3; 257/5; 257/6; 257/55; 257/63; 257/65; 438/900; 438/163; 438/113; 438/114; 438/105
(58) Field of Search ............................. 257/2, 3, 4, 5, 257/6, 55, 63, 65, 316, 529, 530; 365/163, 113, 114, 105; 438/149, 30, 197, 199

(56) References Cited

U.S. PATENT DOCUMENTS

| | | | | |
|---|---|---|---|---|
| 5,406,509 A | * | 4/1995 | Ovshinsky et al. | 365/113 |
| 5,978,258 A | * | 11/1999 | Manning | 365/175 |
| 6,034,882 A | * | 3/2000 | Johnson et al. | 365/103 |
| 6,143,582 A | * | 11/2000 | Vu et al. | 438/30 |
| 6,185,122 B1 | * | 2/2001 | Johnson et al. | 365/103 |
| 6,208,164 B1 | * | 3/2001 | Noble et al. | 326/41 |
| 6,351,406 B1 | * | 2/2002 | Johnson et al. | 365/103 |
| 2002/0028541 A1 | * | 3/2002 | Lee et al. | 438/149 |

* cited by examiner

Primary Examiner—Nathan J. Flynn
Assistant Examiner—Fazli Erdem
(74) Attorney, Agent, or Firm—Blakely, Sokoloff, Taylor & Zafman LLP

(57) ABSTRACT

An apparatus comprising control circuitry formed on a substrate, and a plurality of active media coupled to the control circuitry and formed in a plurality of planes over the substrate. A method comprising forming a pair of junction regions on a substrate separated by a channel length; and forming a channel material overlying and coupled to the pair of junction regions having a dimension at least equal to the channel length. An apparatus comprising a contact formed in a first plane over a device structure; and a device coupled to the contact and formed in a second plane a greater distance from the substrate than the first plane.

29 Claims, 10 Drawing Sheets

METHOD OF FABRICATING A THREE-DIMENSIONAL ARRAY OF ACTIVE MEDIA

BACKGROUND

1. Field of the Invention

The invention relates generally to three dimensional circuit arrays.

2. Background

Typical circuit configurations include a plurality (sometimes hundred, thousands, or millions) of devices formed on a substrate such as a semiconductor substrate or chip and interconnected perhaps to one another or to circuitry external to the substrate through interconnect layers (as many as five or more) over the substrate. Active devices in this case includes, but are not limited to, transistors, capacitors, resistors, diodes, and programmable media (collectively "active media").

Typical memory applications include dynamic random access memory (DRAM), static random access memory (SRAM), erasable programmable read only memory (EPROM), and electrically erasable programmable read only memory (EEPROM). Solid state memory devices typically employ micro-electronic circuit elements for each memory bit (e.g., one to four transistors per bit) in memory applications. Since one or more electronic circuit elements are required for each memory bit, these devices may consume considerable chip "real estate" to store a bit of information, which limits the density of a memory chip.

State or phase change memory devices use materials that can be electrically switched between a generally amorphous and a generally crystalline state. One type of memory element developed by Energy Conversion Devices, Inc. of Troy, Mich. utilizes a phase change material that can be, in one application, electrically switched between a structural state of generally amorphous and generally crystalline local order or between different detectable states of local order across the entire spectrum between completely amorphous and completely crystalline states. Typical materials suitable for such application include those utilizing various chalcogenide elements. These electrical memory devices typically do not require field effect transistor select devices, and comprise, in the electrical context, a monolithic body of thin film chalcogenide material. As a result, very little chip real estate is required to store a bit of information, thereby providing for inherently high density memory chips. The state change materials are also truly non-volatile in that, when set in either a crystalline, semi-crystalline, amorphous, or semi-amorphous state representing a resistance value, that value is retained as that value represents a physical state of the material (e.g., crystalline or amorphous). Thus, phase change memory materials represent a significant improvement in non-volatile memory.

One integrated circuit advancement effort is to increase the number of devices (active media) that can be located on a substrate (e.g., chip). In terms of memory device applications, for example, although phase change memory devices (typically arrays of memory devices) occupy significantly less real estate than traditional solid state memory devices, there remains a desire to increase the device (active media) density.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION

An apparatus is described. In one embodiment, the apparatus includes control circuitry formed on a substrate and active media coupled to the control circuitry and formed in a plurality of planes over the substrate. Adjacent planes of the plurality of active media are separated by a distance less than a minimum feature size of respective ones of the plurality of active media. One way the minimum feature size spacing is achieved is by locating the adjacent ones of the plurality of active media in separate planes, i.e., a third dimension on the substrate. A method of forming three dimensional arrays is also disclosed.

In the following paragraphs and in association with the accompanying figures, an example of a memory array and a memory device is presented. The embodiment describes a programmable material including a phase change material where the phase of the material determines the state of the memory element, but other configurations and types of circuitry are equally likely.

Figure 1:
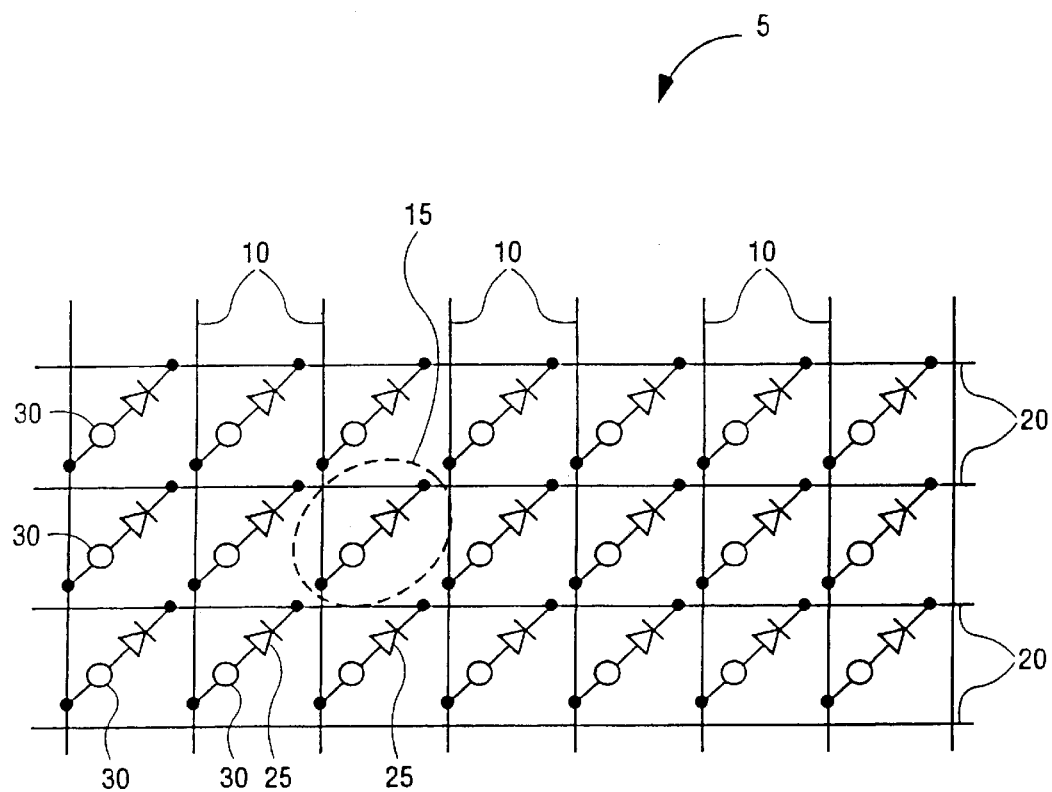
FIG. 1 is a schematic diagram of an array of memory elements.

FIG. 1 shows a schematic diagram of an embodiment of a memory array comprised of a plurality of memory elements. In this example, the circuit of memory array 5 includes an xy grid with programmable elements 30 electrically interconnected in series with isolation devices 25 on a portion of a chip. One memory element is identified as reference numeral 15, including programmable element 30 and isolation device 25, coupled between address or signal lines. Address lines 10 (e.g., columns) and 20 (e.g., rows) are connected, in one embodiment, to external addressing circuitry. One purpose of the xy grid array of programmable elements in combination with isolation devices is to enable each discrete programmable element to be programmed (e.g., read and written) without interfering with the information stored in adjacent or remote programmable elements of the array.

A memory array such as memory array 5 may be formed in and on a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer reduced through singulation into discrete die or chips, some or all of the die or chips having a memory array formed thereon. Additional addressing circuitry (e.g., decoders, etc.) may be formed in a similar fashion.

Figure 2:
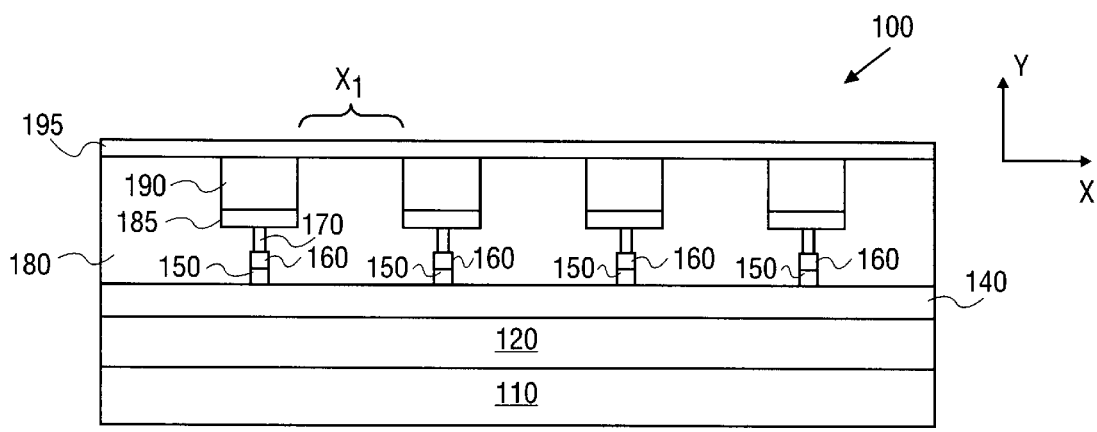
FIG. 2 schematically shows a cross-sectional side view of a portion of a circuit substrate including a plurality of active media coupled to conductors thereon.

FIGS. 2–5 illustrate an embodiment of the fabrication of representative memory element 15 of FIG. 1. FIG. 2 shows a structure from an xy-direction. FIG. 2 shows a plurality of memory elements (e.g., including memory element 15) including, as will be described, a first signal line or conductor (e.g., row line 20 of FIG. 1), isolation devices (e.g., isolation device 25 of FIG. 1), electrodes, programmable elements (e.g., programmable element 30), and second conductor or signal lines (e.g., column line 10).

Referring to FIG. 2, there is shown a portion of substrate 100 that is, for example, a semiconductor substrate. In this example, a P-type dopant such as boron is introduced in portion 110. Overlying portion 110 of substrate 100, in this example, is portion 120 of P-type epitaxial silicon.

Overlying epitaxial portion 120 of substrate 100 is first conductor or signal line material 140. In one example, first conductor or signal line material 140 is N-type doped silicon formed by the introduction of, for example, phosphorous or arsenic (e.g., N+ silicon). In this example, first conductor or signal line material 140 serves as an address line, a row line (e.g., row line 20 of FIG. 1) patterned into strips.

Referring to FIG. 2, overlying first conductor or signal line material 140 are a plurality of isolation devices (e.g., isolation device 25 of FIG. 1). In this example, each isolation device is a PN diode formed of N-type silicon portion 150 and P-type silicon portion 160. The isolation device may be introduced (formed) as a blanket then patterned into cells for individual programmable elements (e.g., having x- and z-dimensions on the order of a minimum feature size, e.g., 0.18 microns). It is appreciated that the z-dimension patterning of the isolation device may be done simultaneously with the patterning of first conductor or signal line, forming strips of signal line and isolation device materials. The strips may then be patterned to define an x-dimension of the isolation device material while retaining the first conductor or signal line material as strips.

Dielectric material 180 is introduced (formed) on first conductor or signal line material 140 and around the individual isolation device cells. Dielectric material 180 is, for example, silicon dioxide ($SiO_2$). Dielectric material 180 is introduced over the structure to a thickness on the order of up to 50,000 Å; enough to encapsulate the cell material (at this point, the isolation devices) and to define (possibly after planarization) a y-direction thickness (height) of a subsequently introduced electrode material.

Referring to FIG. 2, openings are formed through dielectric material 180 to the isolation devices 170. An electrode material of, for example, polycrystalline semiconductor material such as polycrystalline silicon is then introduced in the openings to the isolation device material. For polycrystalline silicon for electrode material 170, the conductivity of the material may be increased by doping techniques (e.g., introducing N-type dopant into the polycrystalline silicon).

A layer of programmable material 185 is introduced on electrode 170. In one example, programmable material 185 is a phase change material. In a more specific example, programmable material 185 includes a chalcogenide element(s). Examples of phase change programmable material 185 include, but are not limited to, compositions of the class of tellerium-germanium-antimony ($Te_xGe_ySb_z$) material. Programmable material 185, in one example according to current technology, is introduced to a thickness on the order of about 600 Å.

Overlying programmable material 185 in the structure of FIG. 2 is second conductor or signal line material 190. In this example, second conductor or signal line material 190 serves as an address line, a column line (e.g., column line 10 of FIG. 1). Second conductor or signal line material 190 is, for example, an aluminum material, such as an aluminum alloy. As shown in FIG. 2, second conductor or signal line material 190 is patterned to be, in one embodiment, generally orthogonal to first conductor or signal line 140 with an x-direction feature size represented as $X_1$. It is appreciated that the patterning of second conductor material 190 and programmable material 185 may be done as blanket layers and then collectively patterned into strips generally orthogonal to first conductor or signal line 140. Overlying second conductor or signal line material 190 is dielectric material 195 in an amount sufficient to encapsulate second conductor or signal line 190.

Figure 3:
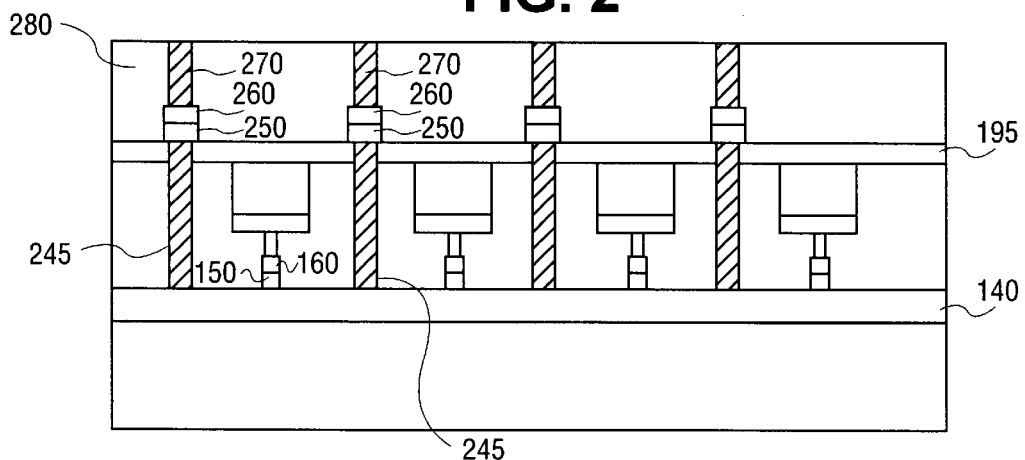
FIG. 3 shows the structure of FIG. 2 following the introduction of a dielectric material over the substrate and forming of electrodes to the conductor on the substrate.

FIG. 3 shows the structure of FIG. 2 following the introduction (formation) of second level openings to first conductor signal line 140. In this case, openings are made through dielectric layer 195 and dielectric layer 180. Photolithographic techniques may be used to form such openings. Following the formation of the openings, electrode material 245 is introduced into the openings. In one embodiment, electrode material 245 is polycrystalline silicon. The polycrystalline silicon may be doped with, for example, N-type dopant (e.g., phosphorous or arsenic) to increase the conductivity of electrode material 245.

Overlying electrode material 245, in this example, a second series of isolation devices (e.g., isolation device 25 of FIG. 1) is introduced. In this example, the isolation devices are again PN diodes formed of N-type silicon portion 250 and P-type silicon portion 260. The isolation devices may be introduced (formed) as a blanket then patterned into cells for individual programmable elements (e.g., having x- and z-dimensions on the order of minimum feature size, e.g., 0.18 microns).

Following the introduction of the isolation device, dielectric material 280 is introduced (formed) over and around the individual isolation device cells. Suitable dielectric 280 is, for example, silicon dioxide ($SiO_2$). Dielectric material 280 is introduced over the structure to a thickness on the order of up to 50,000 Å; enough to encapsulate the cell material (at this point, the isolation devices) and to define (possibly after planarization) a y-direction thickness (height) of a subsequently introduced electrode material.

Referring to FIG. 3, openings are formed through dielectric material 280 to the isolation devices for example, by photolithographic techniques. Electrode material 270 of, for example, polycrystalline silicon is then introduced in the openings to the isolation device material. For polycrystalline silicon of electrode material 270, the conductivity of the material may be increased by doping techniques.

Figure 4:
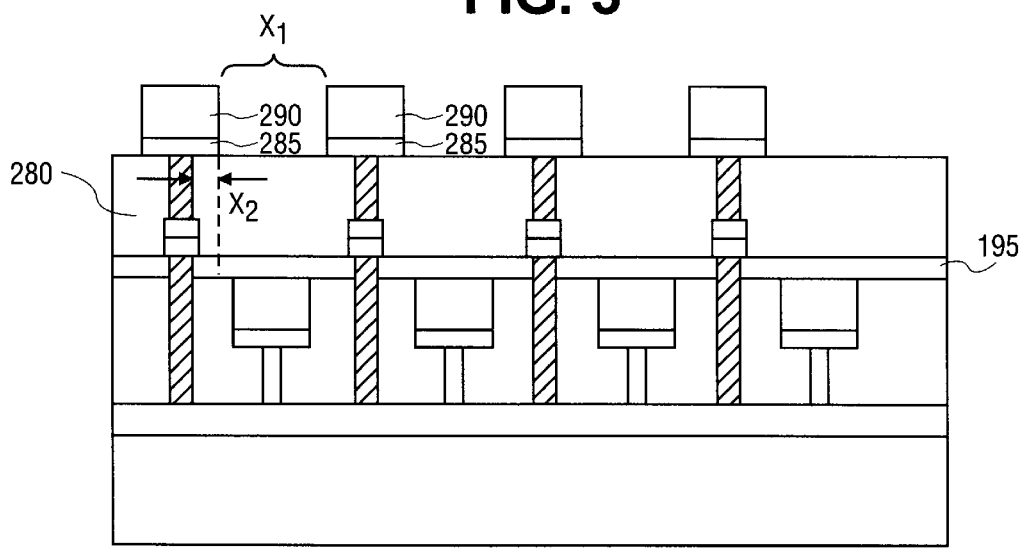
FIG. 4 shows the structure of FIG. 3 following the introduction of a second plurality of active media on the dielectric material coupled to the electrode.

FIG. 4 shows the substrate of FIG. 3 following the introduction of a second level of programmable material 285 and the second level of second conductor or signal line material 290. Second level of programmable material 285 may also be a phase change material (e.g., including chalcogenide element). A second level of second conductor or signal line material 290 serves as an address on a column line (e.g., column line 10 of FIG. 1). The second level of second conductor or signal line material 290 is, for example, an aluminum material, such as aluminum alloy. As shown in FIG. 4, second level of second conductor or signal line material 290 is patterned to be, in one embodiment, generally orthogonal to first conductor or signal line 140. It is appreciated that introducing (forming) second level of second conductor or signal line material 290 and the second level of programmable material 285 may be done as blanket layer depositions and then collectively patterned into strips generally orthogonal to first conductor or signal line 140.

Figure 5:
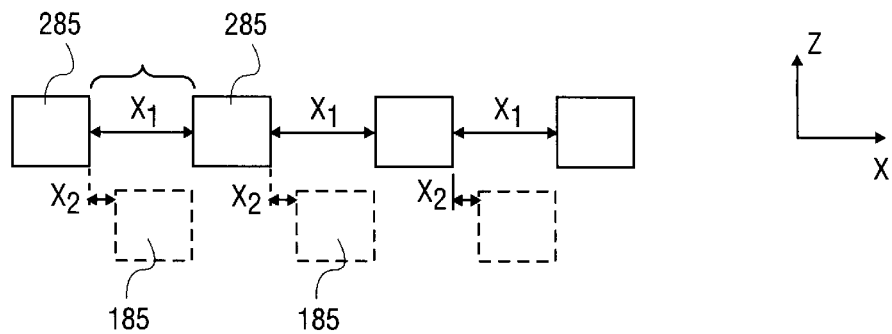
FIG. 5 shows a schematic top view of the structure of FIG. 4.

In one embodiment, the structure of FIG. 4 is patterned as described, the distance (x-direction distance in this example) between second conductor or signal lines material 290 (columns/programmable material, represented as second conductor or signal line second level programmable material 285 are patterned to be a minimum feature size distance illustrated as $X_1$ (e.g., 0.18 μm). Because the second level structures are formed in a manner such that second level structures are isolated form the first level structures (e.g., first level of second conductor or signal line material 190 and first level programmable material 185), the distance between the second level conductor or signal line material (and programmable material) may be less than the minimum feature size required for patterning at the same level. As illustrated, an x-direction distance ($X_2$) between second level second conductor or signal line material 290 (and second level programmable material 285) is less than the minimum feature size $X_1$ between conductors or signal lines (and programmable material) of the same level ($X_2 < X_1$). FIG. 5 shows the structure of FIG. 4 from an XZ perspective. In one example, the minimum feature size may be reduced by one-half such that the distance between second level second conductor or signal line material 290 is separated along an x-dimension from the first level of second conductor or signal line material 190 by a distance on the order of 0.09 microns.

By alternating levels of adjacent active media such as programmable material or conductors or signal lines, the minimum feature size may be reduced beyond the limits associated with conventional photolithography techniques. In such manner, by patterning structures, in this example, in a y-dimension or direction, the feature size is reduced. By reducing the feature size, the density of active media over an area of, for example, a chip, memory chip (memory portion or chip, etc.) may be significantly increased. It is appreciated, to further increase the density of the active media in an area of, for example, a substrate that is a chip, third, fourth, and n levels may be introduced such as described by the operations detailed in FIGS. 2–4. In the embodiment, the density of active media on a substrate is increased by the formation of "three-dimensional" active media on a substrate.

The above example related to active media as part of a programmable array such as a programmable memory array. It is appreciated that other structures may be formed in the same manner to further increase substrate density as described.

Figure 6:
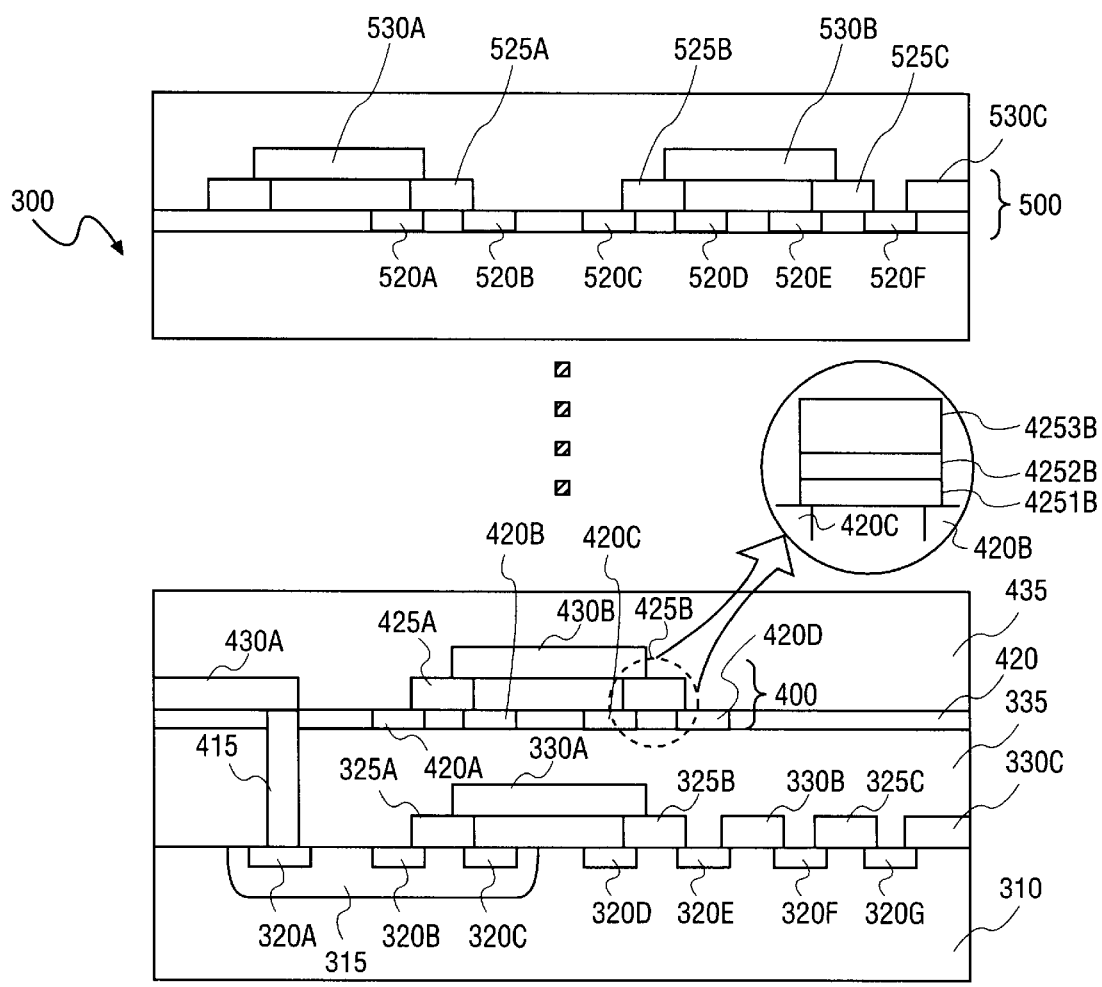
FIG. 6 shows a second embodiment of a substrate having active media formed on a surface and a dielectric layer overlying the surface in a three-dimensional array.

FIG. 6 shows a structure wherein a plurality of active media, in this case transistor devices, may be stacked as a three-dimensional array. Such an array, may be part of a logic array in, for example, a microprocessor, where the transistor devices form part of a circuit (e.g., a logic circuit).

Referring to FIG. 6, structure 300 includes substrate 310 that is, for example, a semiconductor substrate. In one example, substrate 310 is a P-type doped silicon semiconductor substrate. Formed in substrate 310 are a plurality of circuit devices, such as transistor devices. Illustrated, in this example, as part of conventional circuit device components are N-well 315 and junction regions 320A–320G formed in substrate 310. On substrate 310 are formed gate electrodes 325A–325C. Also formed on substrate 310 and coupled to junction regions or gate electrodes are patterned metal lines 330A–330C. The circuitry may be formed by way of conventional circuit techniques utilizing minimum feature size patterning to, in one example, increase the device density over an area of substrate 310.

Overlying the first level device structure described in FIG. 6 is dielectric material 335 of, for example, silicon dioxide ($SiO_2$) that may be introduced as a blanket to encapsulate the device structures. In one embodiment, a superior surface (as viewed) of dielectric material 335 is planarized by way of, for example, a chemical-mechanical polish (CMP).

Overlying and coupled to device structures formed in and on substrate 310 (e.g., a first level of device structures), FIG. 6 shows second level device structures 400. One technique for forming the second level device structures is illustrated in FIGS. 7–11.

Figure 7:
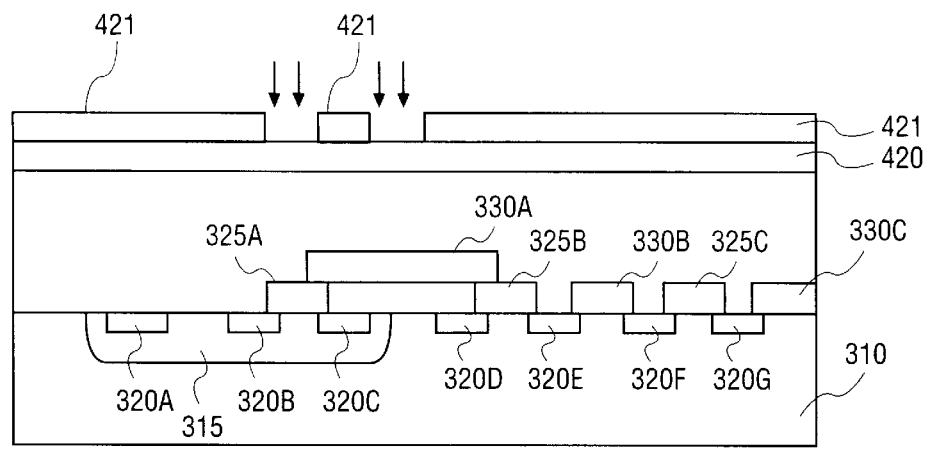
FIG. 7 shows a portion of the structure of FIG. 6 illustrating the formation of junction regions at a second device level.
Figure 8:
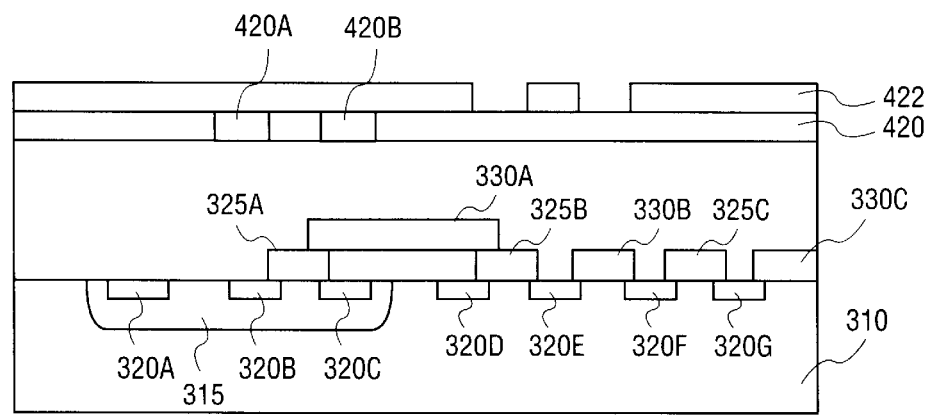
FIG. 8 shows the structure of FIG. 7 illustrating the formation of other junction regions at a second device level.

Referring to FIG. 7, following the introduction and possible planarization of dielectric layer 335, active material layer 420 of intrinsic semiconductor (silicon) is deposited over the surface as a blanket at a thickness desired or suitable for device junctions. A portion of the active layer is then masked with photoimageable material 421 (e.g., photoresist) exposing areas of active layer 420. One of P-type and N-type dopants are then introduced in exposed portions of active layer 420 via, for example, ion implantation. Referring to FIG. 8, photoimageable material 421 is then removed and a separate portion of the active layer is then masked with photoimageable material 422 (e.g., that portion that received the dopant). The other of the P-type and N-type dopant is then introduced in exposed portions of the active layer. The photoimageable material may then be replaced with another photoimageable material to pattern the active layer into discrete device junctions. An alternative technique for forming junction regions is to deposit a first active layer doped (either before or after deposit) to one of P-type and N-type dopant and pattern the layer into the desired device junction(s). A second active layer is then deposited in the same plane with the other of P-type and N-type dopant and patterned into the desired device junction (s).

Figure 9:
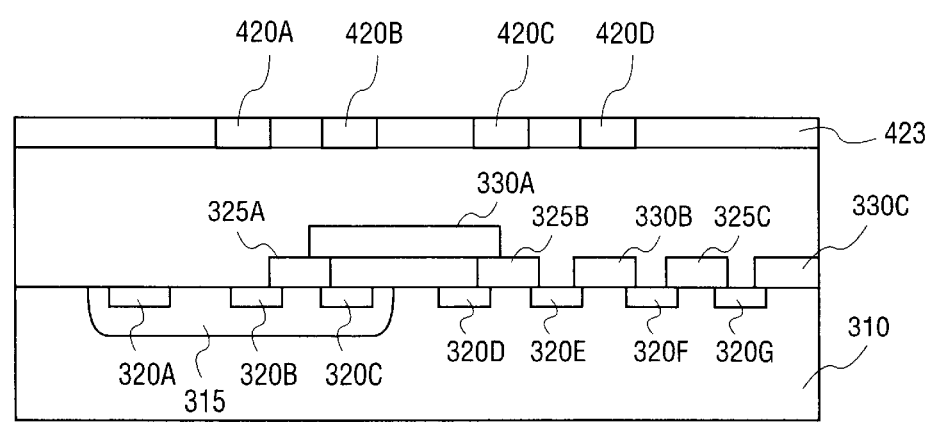
FIG. 9 shows the structure of FIG. 8 after junction regions are formed at the second device level.

FIG. 9 shows the structure of FIG. 7 following the formation of junction regions 420A–420D. Once the junctions are formed, dielectric material (e.g., $SiO_2$) may be introduced over the surface and the surface planarized, if necessary, to expose junctions 420A–420D. As shown in FIG. 9, dielectric material 423 separates junction regions forming a "channel" region between, for example, junction region 420A and junction region 420B. It is appreciated that such "channel" region of dielectric material will generally not provide a path for electron flow.

Figure 10:
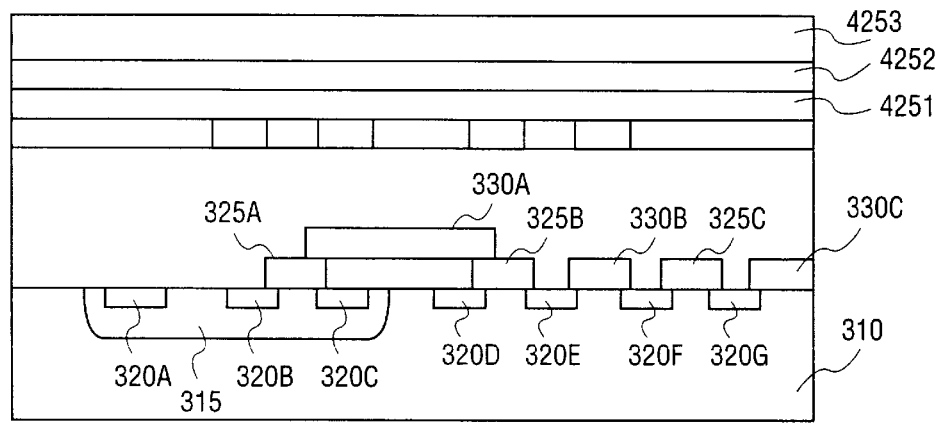
FIG. 10 shows the structure of FIG. 9 following the introduction of gate stack materials.
Figure 11:
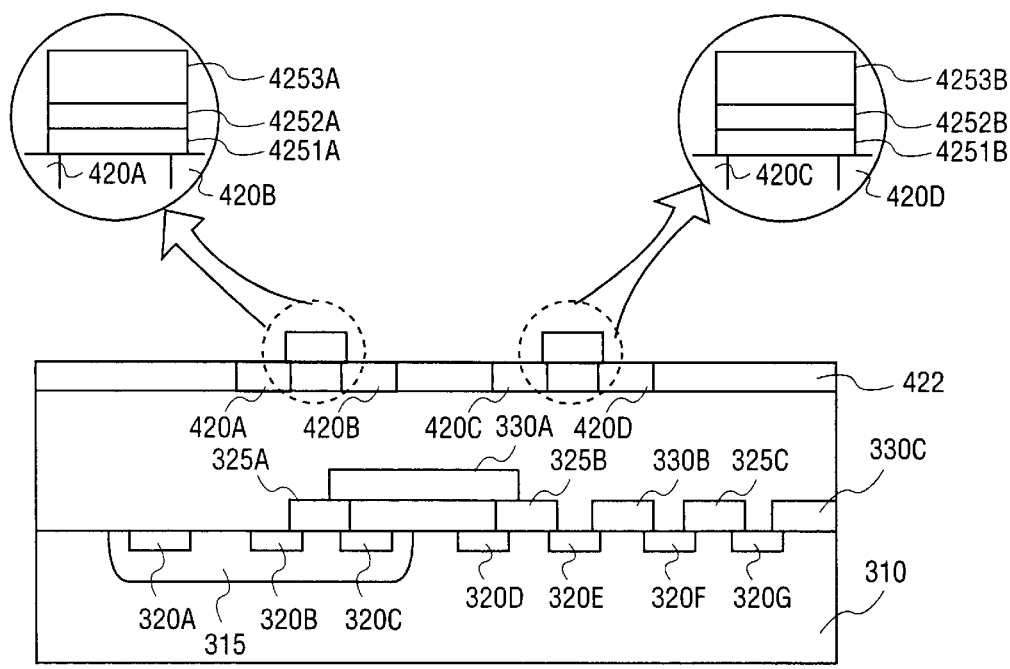
FIG. 11 shows the structure of FIG. 10 after patterning the gate stack materials into gate electrodes.

FIG. 10 shows the structure of FIG. 9 following the introduction (deposition) of a "gate stack" of intrinsic semiconductor 4251 (e.g., silicon), dielectric material 4252, and gate electrode material 4253 as blanket layers. FIG. 11 shows the gate stacks patterned into gate electrodes adjacent the desired junctions. The exploded inset of gate electrode 425B shows a patterned gate stack of intrinsic semiconductor portion 4251B, dielectric (gate oxide) portion 4252B, and gate material portion 4253B of, for example, polycrystalline semiconductor (e.g., silicon).

Referring to the inset of FIG. 6 or FIG. 11, device junction regions (source/drain regions) form in intrinsic portion 4251B through auto-doping from doped junction regions 420C and 420D as those areas contact the gate stack. Subsequent thermal anneals or other methods may also be utilized to diffuse dopants. Intrinsic semiconductor portion 4251B between junction regions 420C and 420D (under gate electrode 4253B) acts as a device channel for electron (hole) flow.

Following formation of the second level device structures, additional dielectric material may then be introduced (formed) around the gate electrodes and planarized to expose the gate electrode. Signal line material may be introduced either before the introduction of dielectric material (in the case where signal lines are formed to junctions) or following the introduction of dielectric material and exposure of gate electrode material to form the desired signal line. Referring to FIG. 6, signal lines 430A and 430B are shown as the second level of signal line material. Conductive via 415 is shown between signal line 430A and junction region 320A on the first level.

FIG. 6 shows n-level of devices 500 formed over substrate 310. In this case, the n-level of active devices include junction regions 520A–520F formed in dielectric material and transistor gate devices 525A–525C formed to desired junctions. The techniques described above with respect to FIGS. 6–11 may be employed at this level. Signal line materials 530A and 530B is then formed to the desired gate electrodes or junctions as illustrated and described below with regard to the second level of devices.

In FIG. 6, CMOS second level device structures are illustrated. It is appreciated that resistors, capacitors, veractors, interconnect, etc. may be formed by similar methods. The transistor device structure shown illustrates a gate-controlled transistor structure contacted from beneath the channel by device junction contacts. A CMOS/MOS/MIS configuration is illustrated, but other configurations are equally likely (e.g., junction transistors, bipolar transistors, etc.).

Figure 12:
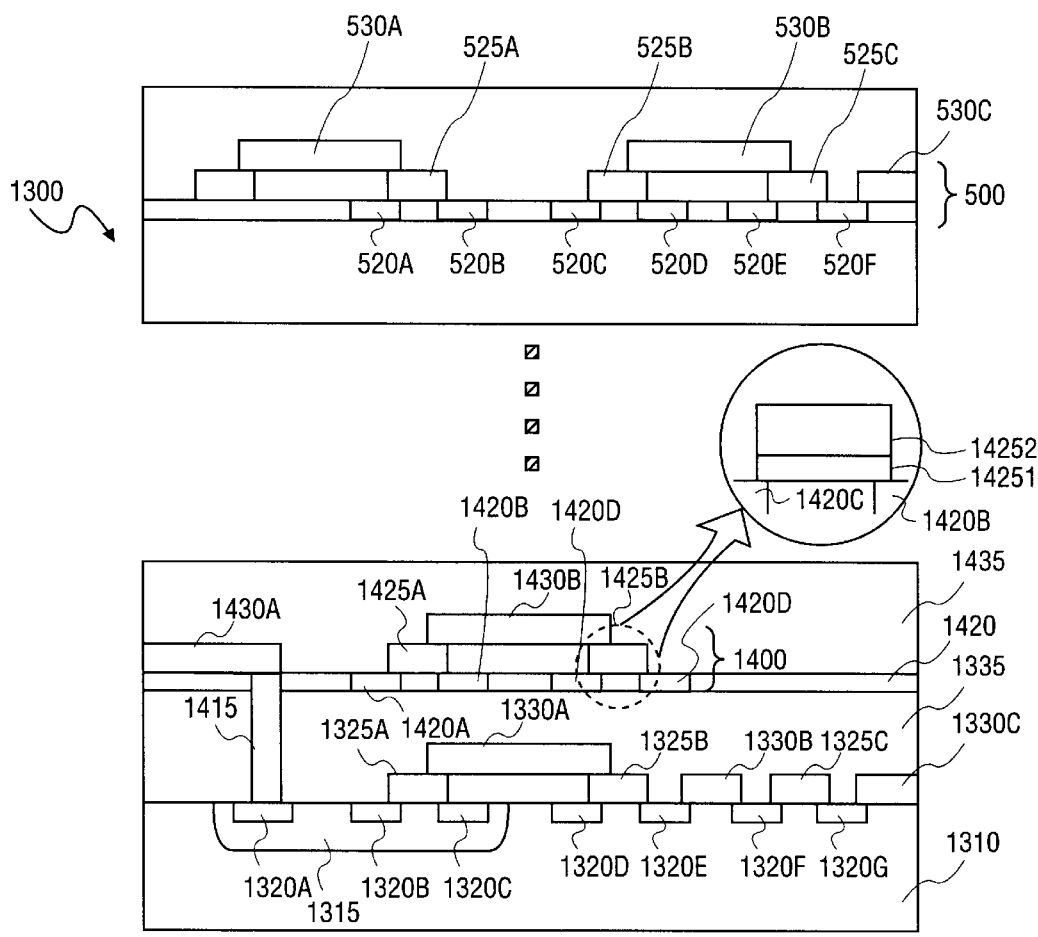
FIG. 12 shows a third embodiment of a substrate having active device media formed on a surface and a dielectric layer overlying the surface in a three-dimensional array.

FIG. 12 shows a second structure wherein a plurality of transistor devices are stacked as a three-dimensional array. Referring to FIG. 12, structure 1300 includes substrate 1310 of, for example, a P-type doped semiconductor (e.g., silicon) material. Formed in substrate 1310 are a plurality of transistor devices according to conventional techniques. Illustrated, in this example, as part of first level device components are N-well 1315 and junction regions 1320A–1320G formed in substrate 1310. On substrate 1310 are formed gate electrodes and patterned metal lines 1330A–1330C.

Overlying the first level device structure is dielectric material 1335 of, for example, $SiO_2$ introduced as a blanket to encapsulate the device structure. In one embodiment, a superior surface (as viewed) of dielectric material 1335 is planarized by way of, for example, a CMP.

Figure 13:
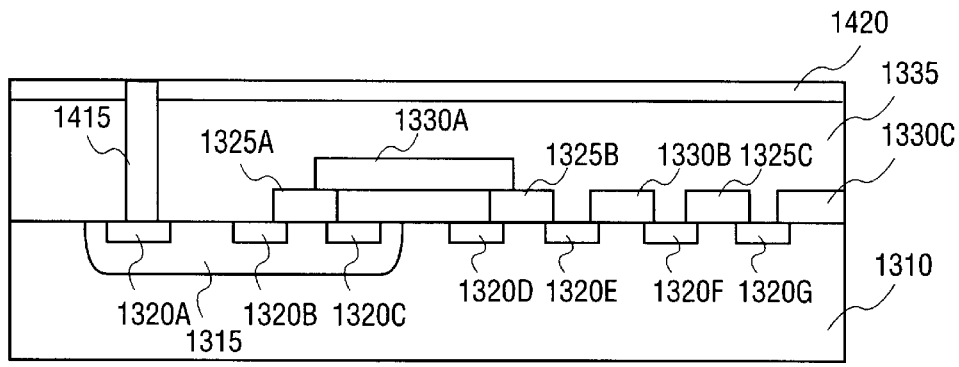
FIG. 13 shows a portion of the structure of FIG. 12 following the introduction of junction material at a second device level.

Overlying and coupled to device structures formed in and on substrate 1310 (e.g., a first level of device structures), FIG. 12 shows second level device structures 1400. FIG. 13 shows the structure after introducing (depositing) dielectric material 1335 and following the introduction of active layer 1420 of intrinsic semiconductor (silicon) material that may or may not be doped. A CMP may follow the deposition to planarize active layer 1420.

Figure 14:
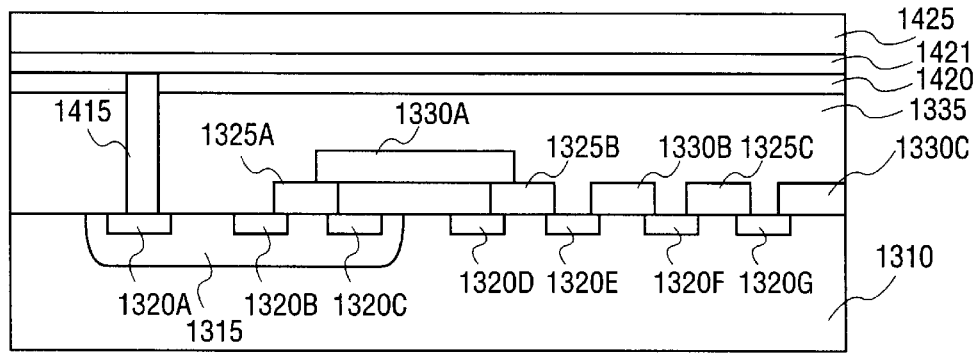
FIG. 14 shows the structure of FIG. 12 following the introduction of gate dielectric and gate electrode material.
Figure 15:
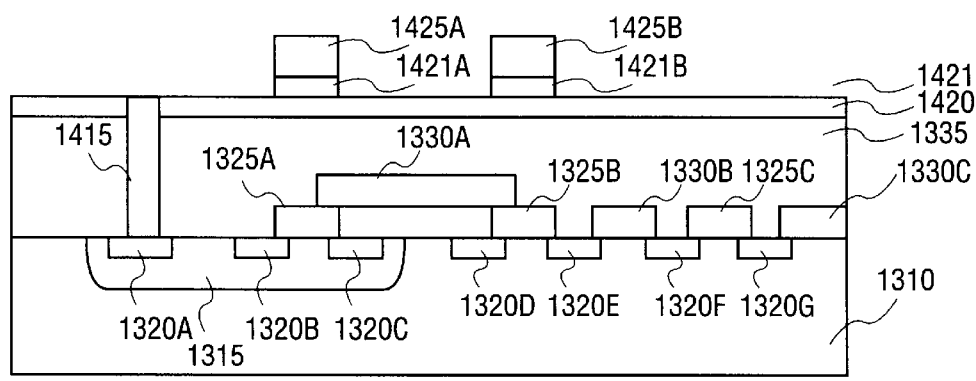
FIG. 15 shows the structure of FIG. 14 following the patterning of the gate electrode and gate dielectric material.
Figure 16:
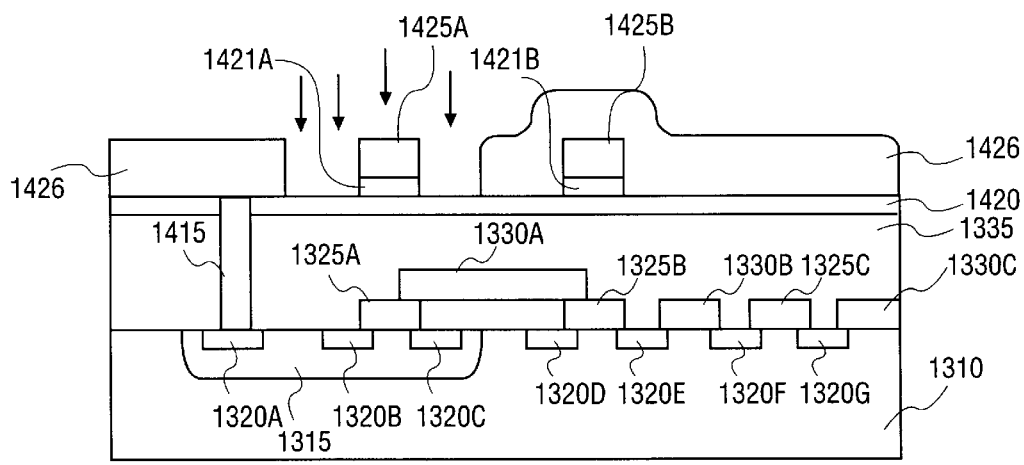
FIG. 16 shows the structure of FIG. 15 illustrating the formation of junction regions.
Figure 17:
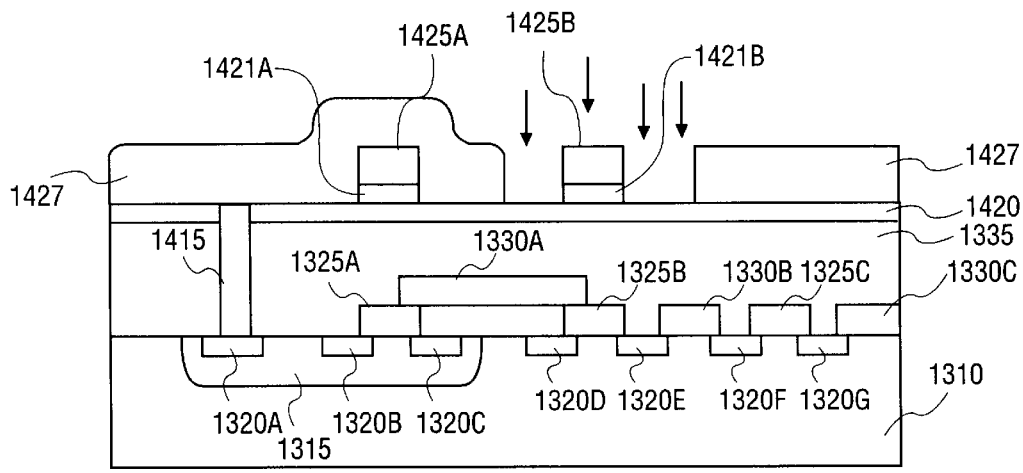
FIG. 17 shows the structure of FIG. 16 illustrating the formation of other junction regions.
Figure 18:
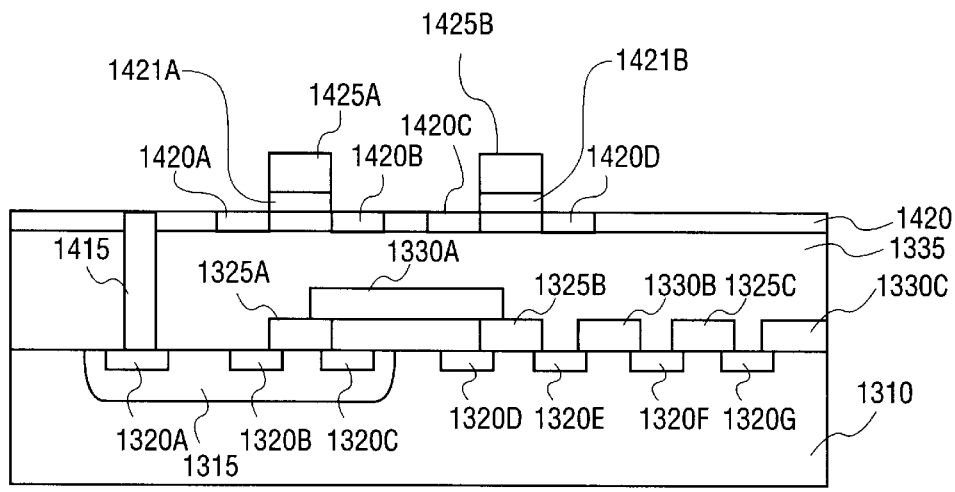
FIG. 18 shows the structure of FIG. 17 after forming the second level of active devices.
Figure 19:
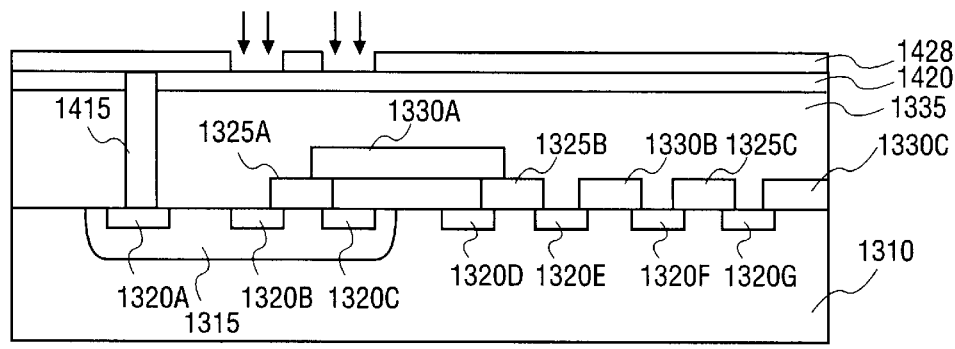
FIG. 19 shows the structure of FIG. 13 illustrating the formation of junction regions in an alternative technique to that described in FIGS. 14–18.

Following deposition and optional planarization, junction regions 1420A–1420D (source/drain regions) are formed. One technique to form junction regions 1420A–1420D is shown in FIGS. 14–18. Referring to FIG. 14, gate dielectric material 1421 and gate electrode material 1425 are deposited as a gate stack. The gate stack is then patterned into gate electrodes 1425A and 1425B over gate dielectric 1421A and gate dielectric 1421B, respectively, as shown in FIG. 15. Masking material 1426 is then patterned over the structure to expose areas of junction regions adjacent one or both of gate electrodes 1425A and 1425B (the gate electrodes may also be exposed). One of a P-type and an N-type dopant is then introduced (implanted) into the exposed portions of the active layer (and gate electrode(s)) as shown in FIG. 16. The implantation, in this example, is aligned to the gate electrode. Where desired, the mask patterning may then be modified to expose other junction areas and gate electrodes to the other of the P-type and N-type dopant. FIG. 17 shows masking material 1427 over the superior surface (as viewed) exposing gate electrode 1425 and areas adjacent gate electrode 1425. FIG. 18 shows the structure with junction regions 1420A–1420D formed in active layer 1420.

Figure 20:
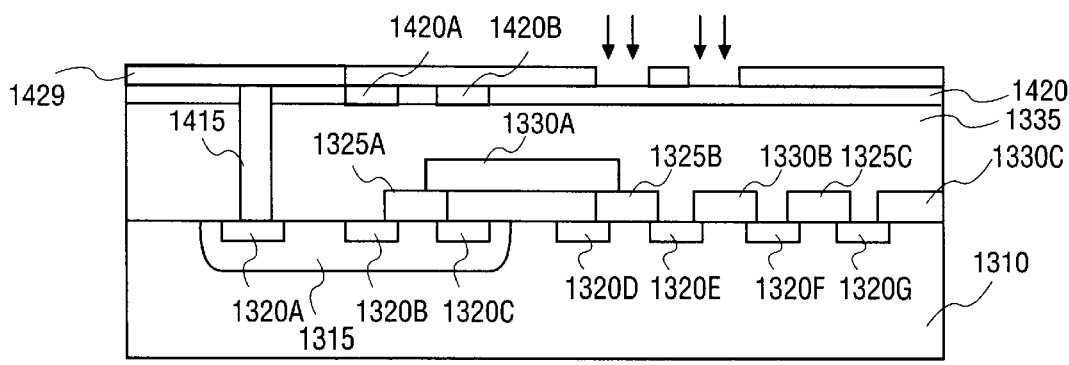
FIG. 20 shows the structure of FIG. 19 illustrating the formation of other junction regions.
Figure 21:
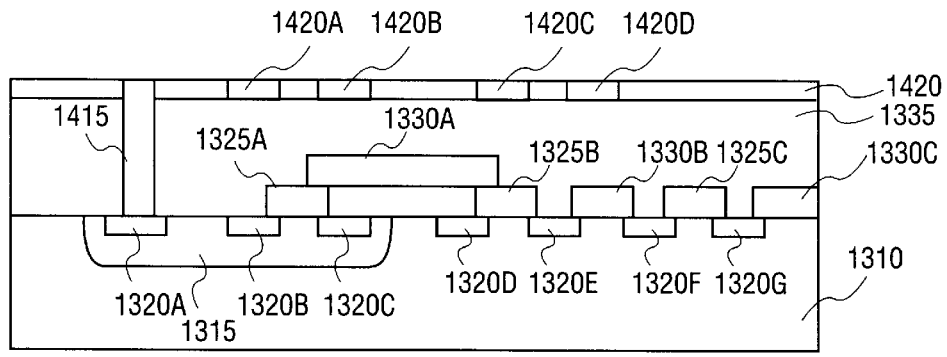
FIG. 21 shows the structure of FIG. 20 following the formation of junction regions.

A second technique to form junction regions 1420A–1420D is to form the junction regions through, for example, mask patterning and doping, prior to introducing (depositing) and patterning the gate dielectric and gate electrode material. Referring to FIGS. 19–23, following the deposition of active layer 1420, masking material 1428 is introduced over the structure and patterned to expose areas for junction regions. A suitable dopant (e.g., P-type or N-type) is then introduced into active layer 1420 to form, in this instance, junction regions 1420A and 1420B. Masking material 1428 is then removed and masking material 1429 introduced and patterned to expose areas for other junction regions. An alternate dopant is then introduced to form junction regions 1420C and 1420D as shown in FIG. 20. FIG. 21 shows the structure after the formation of junction regions 1420A–1420D and the removal of masking material.

Figure 22:
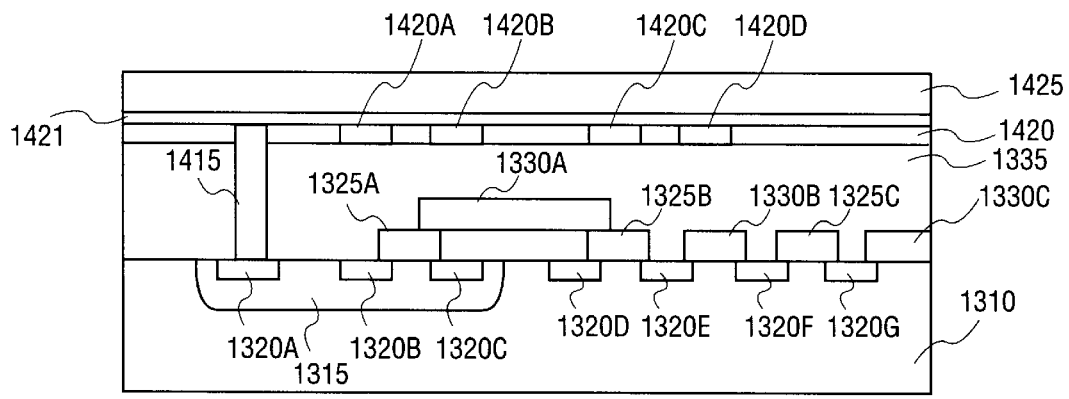
FIG. 22 shows the structure of FIG. 21 following the introduction of gate dielectric material and gate electrode material.
Figure 23:
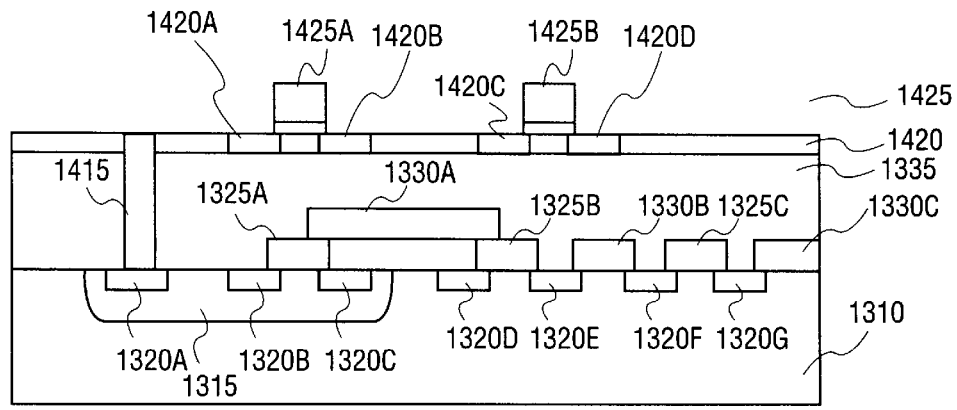
FIG. 23 shows the structure of FIG. 22 following the patterning of the gate electrode and gate dielectric material.

Following the formation of junction regions 1420A–1420D, gate dielectric material 1421 (e.g., $SiO_2$) and gate electrode material (e.g., polycrystalline silicon) 1425 is introduced (deposited) over the structure as shown in FIG. 22. FIG. 23 shows the structure after patterning this material into gate electrode 1425A and gate electrode 1425B. It is appreciated that intrinsic areas between devices (e.g., between the device associated with gate electrode 1425A and the device associated with gate electrode 1425B) may or may not be removed or may contain other devices.

Referring again to FIG. 12, signal lines 1430A and 1430B are shown as the second level of signal line material. Conductive via 1415 is shown between signal line 1430A and junction region 1320A on the first level.

FIG. 12 also shows n-level of active devices 500 formed over substrate 1310. n-level of devices 500 include junction regions 520A–520F formed in dielectric material and transistor gate devices 525A–525C formed to desired junctions. The techniques described above with reference to FIGS. 13–23 may be used to form these devices. Signal line material 530A-530B is then formed where necessary.

The examples illustrated in FIGS. 12–23 relate to a CMOS/MOS/MIS structure. It is appreciated that other configurations are equally likely (e.g., junction transistors, bipolar transistors, etc.) as are devices other than transistors.

It is appreciated that the various devices on the multi-levels formed over the substrate (e.g., substrate 310) may be coupled by way of conductive vias formed using etch patterning and deposition techniques.

In the examples presented above, active media of programmable material (e.g., memory material) and transistor devices are described in terms of three dimensional device structures. It is appreciated that various other active media including, but not limited to, capacitors, resistors, junctions (diodes) may be formed by similar techniques.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus comprising:
   control circuitry formed on a substrate, wherein the control circuitry comprises a conductor; and
   a plurality of active media coupled to the conductor and formed in a plurality of planes over the substrate, wherein adjacent ones of the plurality of active media are separated by a distance less than a minimum feature size of respective ones of the plurality of active media.

2. The apparatus of claim 1, wherein the adjacent ones of the plurality of active media are in separate planes.

3. The apparatus of claim 2, wherein the active media comprises programmable material.

4. The apparatus of claim 3 further comprising:
   a plurality of first contacts formed on the substrate and coupled to the control circuitry; and
   a plurality of second contacts formed on the substrate and coupled to the control circuitry, wherein respective ones of the plurality of active media are coupled to and disposed between respective ones of the plurality of first contacts and the plurality of second contacts.

5. The apparatus of claim 4, further comprising:
   a plurality of electrodes coupled to the plurality of first contacts and respective ones of the plurality of active media.

6. An apparatus comprising:
   a plurality of first address lines and a plurality of second address lines on a substrate;
   a plurality of active media formed in a plurality of planes over the substrate, adjacent ones of the plurality of active media separated by a distance less than a minimum feature size and each of the plurality of active media coupled to respective ones of a plurality of first address lines and a plurality of second address lines; and
   addressing circuitry coupled to the plurality of first address lines and the plurality of second address lines.

7. The apparatus of claim 6, wherein the adjacent ones of the plurality of active media are in separate planes.

8. The apparatus of claim 7, wherein the active media comprises programmable material.

9. The apparatus of claim 8, wherein respective ones of the plurality of active media are disposed between respective ones of the plurality of first address lines and respective ones of the plurality of second address lines.

10. The apparatus of claim 9, further comprising a plurality of electrodes coupled to respective ones of the first address lines and respective ones of the plurality of programmable elements.

11. An apparatus comprising:
    a dedicated memory chip comprising a plurality of first address lines and a plurality of second address lines on a substrate;
    a plurality of units of programmable material formed in a plurality of planes over the substrate, adjacent ones of the plurality of active media separated by a distance less than a minimum feature size and each of the plurality units of programmable material coupled to respective ones of a plurality of first address lines and a plurality of second address lines; and
    addressing circuitry coupled to the plurality of first address lines and the plurality of second address lines.

12. The apparatus of claim 11, wherein the adjacent ones of the plurality of units of programmable material are in separate planes.

13. The apparatus of claim 12, wherein respective ones of the plurality of units of programmable material are disposed between respective ones of the plurality of first address lines and respective ones of the plurality of second address lines.

14. The apparatus of claim 12, further comprising a plurality of electrodes coupled to respective ones of the first address lines and respective ones of the plurality of programmable elements.

15. A method comprising:
    forming a conductor on a first level;
    forming a plurality of units of active media on a second level;
    forming adjacent units of active media in different planes over a third level, the adjacent units of active media separated by a distance less than a minimum feature size;
    coupling the plurality of units on the second level to the conductor; and
    coupling the adjacent units of active media over the third level to the conductor.

16. The method of claim 15, wherein the adjacent units of active media comprise programmable material and the conductor comprises at least one first address line, the method further comprising forming at least one second address line on the first level coupled to a portion of the plurality of units of active media.

17. The method of claim 16, further comprising forming a plurality of electrodes, respective ones of the plurality of electrodes coupled between the at least one first address line and respective ones of the plurality of units of active media.

18. A method comprising:

forming a plurality of active layers over a device layer of a substrate in a stacked configuration;

in each active layer forming a pair of junction regions in a single plane the active layer separated by a channel; and in each active layer forming a gate electrode on the channel.

19. The method of claim 18, wherein forming a gate electrode comprises:

forming a first layer of semiconductor material on the channel and coupled to the pair of junction regions;

forming a dielectric layer on the first layer of semiconductor material; and forming a second layer of gate electrode material on the dielectric layer.

20. The method of claim 19, wherein the pair of junction regions comprise a dopant and forming the first layer of semiconductor material further comprises doping the first layer in portions coupled to the pair of junction regions.

21. The method of claim 20, wherein the doping of the first layer comprises diffusing dopants from the pair of junction regions.

22. The method of claim 18, wherein the active layer is formed over a dielectric material on the substrate over a first level of active media, and forming a pair of junction regions follows forming a gate electrode, the gate electrode being used as a boundary for forming the pair of junction regions.

23. A method comprising:

forming a pair of junction regions on a substrate separated by a channel length; and forming a channel material overlying and coupled to the pair of junction regions having a dimension at least equal to the channel length.

24. The method of claim 23, further comprising forming a gate electrode on the channel material.

25. The method of claim 23, wherein the pair of junction regions comprise a dopant and forming the channel material further comprises doping the channel material in portions coupled to the pair of junction regions.

26. The method of claim 25, wherein doping the channel material comprises diffusing dopants from the pair of junction regions.

27. An apparatus comprising:

a contact formed in a first plane over a device structure; and a device coupled to the contact and formed in a second plane a greater distance from the substrate than the first plane.

28. The apparatus of claim 27, wherein the contact comprises a junction region and the device comprises gate electrode and a channel region of a transistor device.

29. The apparatus of claim 28 wherein the device comprises one of a resistor, a capacitor, a transistor, and a veracitor.

* * * * *